US012417369B2

(12) United States Patent
Ezrielev et al.

(10) Patent No.: US 12,417,369 B2
(45) Date of Patent: *Sep. 16, 2025

(54) POLYSACCHARIDE ARCHIVAL STORAGE

(71) Applicant: Dell Products L.P., Round Rock, TX (US)

(72) Inventors: Ofir Ezrielev, Beer Sheva (IL); Avitan Gefen, Tel Aviv (IL); Jehuda Shemer, Kfar Saba (IL)

(73) Assignee: Dell Products L.P., Round Rock, TX (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/632,154

(22) Filed: Apr. 10, 2024

(65) Prior Publication Data
US 2024/0273332 A1    Aug. 15, 2024

Related U.S. Application Data

(63) Continuation of application No. 17/647,783, filed on Jan. 12, 2022, now Pat. No. 12,014,256.

(51) Int. Cl.
*G06N 3/00* (2023.01)
*G11C 13/00* (2006.01)

(52) U.S. Cl.
CPC ......... *G06N 3/002* (2013.01); *G11C 13/0016* (2013.01)

(58) Field of Classification Search
CPC ..................... G06N 3/002; G11C 13/0016
See application file for complete search history.

(56) References Cited

U.S. PATENT DOCUMENTS

| | | | |
|---|---|---|---|
| 6,597,996 B1 | 7/2003 | Venkataraman et al. | |
| 9,700,612 B2 | 7/2017 | Kowarik et al. | |
| 11,514,331 B2 | 11/2022 | Bathe et al. | |
| 11,928,603 B2* | 3/2024 | Diamanti | G06N 3/123 |
| 2004/0197933 A1 | 10/2004 | Venkataraman et al. | |
| 2009/0274736 A1 | 11/2009 | Dillon et al. | |
| 2017/0116372 A1* | 4/2017 | Baughman | G06N 20/00 |
| 2018/0125926 A1 | 5/2018 | Williams et al. | |
| 2018/0365276 A1 | 12/2018 | Smirnov | |
| 2019/0040459 A1 | 2/2019 | Efcavitch et al. | |
| 2023/0073209 A1 | 3/2023 | Bathe et al. | |

OTHER PUBLICATIONS

"Startup packs all 16GB of Wikipedia onto DNA strands to demonstrate new storage tech," CNET/TECH, Retrieved at https://www.cnet.com/tech/computing/startup-packs-all-16gb-wikipedia-onto-dna-strands-demonstrate-new-storage-tech/, Retrieved on Jun. 2019, pp. 1-4.

(Continued)

*Primary Examiner* — Baboucarr Faal
(74) *Attorney, Agent, or Firm* — Workman Nydegger

(57) ABSTRACT

One example method includes encoding data as a polysaccharide structure, synthesizing the polysaccharide structure to create polysaccharide storage media that comprises the data, and storing the polysaccharide storage media. The example method may also include receiving a read request directed to the polysaccharide storage media, mapping the polysaccharide structure to create a map in response to the read request, traversing the map of the polysaccharide structure to determine an X-base number, and obtaining the data by converting the X-base number to a binary form.

20 Claims, 6 Drawing Sheets

(56) References Cited

OTHER PUBLICATIONS

Inagaki, Masanori, et al. "Detecting and Differentiating Monosaccharide Enantiomers by 1H NMR Spectroscopy." Journal of Natural Products 84.7 (2021): 1863-1869.

Joseph A.A. et al., "Total Synthesis of Polysaccharides by Automated Glycan Assembly," Journal of the American Chemical Society, vol. 142, Issue 19, 2020, pp. 8561-8564.

Matange, Karishma, James M. Tuck, and Albert J. Keung. "DNA stability: a central design consideration for DNA data storage systems." Nature communications 12.1 (2021): 1-9.

Wikipedia, "Polysaccharide," Retrieved at https://en.wikipedia.org/wiki/Polysaccharide, Retrieved on Mar. 2022, pp. 1-10.

* cited by examiner

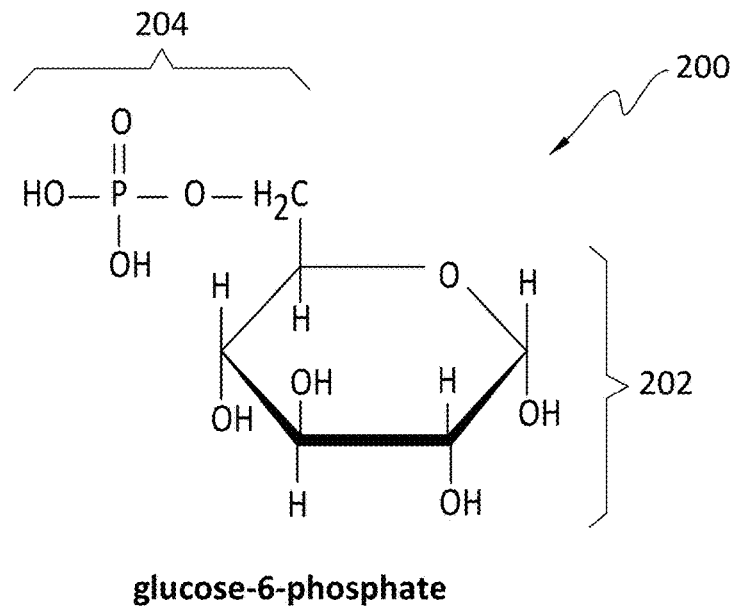

glucose-6-phosphate

FIG. 2

Table 1. Comparison of Automated Solid-Phase Syntheses of Biopolymers

| biopolymer | peptides | DNA | RNA | polysaccharides |
|---|---|---|---|---|
| introduced | 1963[1] | 1981[2] | 1998[3] | 2001[10] |
| structure | linear | linear | linear | branched; regiocontrol required! |
| linkage | amide | phosphodiester | phosphodiester | glycoside bond |
| stereogenic center | no | no | no | yes; stereocontrol required! |
| capping | for selected sequences | routinely | routinely | recently added |
| coupling yield | 99.5 | >99.99 | 98.5 | 98.75 |
| length | 50-100 mer | ≈200 | 120 | 100 mer (this work) |

FIG. 3

POLYSACCHARIDE ARCHIVAL STORAGE

FIELD OF THE INVENTION

Embodiments of the present invention generally relate to archive storage. More particularly, at least some embodiments of the invention relate to systems, hardware, software, computer-readable media, and methods for the use of polysaccharides for archival data storage and associated IO operations.

BACKGROUND

Currently, archival data storage typically employs magnetic tapes or disks drives. Due to recognized problems with these approaches, attention has turned to the use of DNA (deoxyribonucleic acid) data storage. While DNA storage technology is advancing, it has a number of disadvantages.

For example, DNA has 4 states, which is only double those of a computer bit which can assume values of either '0' or '1.' As another example, DNA requires special storage conditions to maintain its stability. One approach is the encapsulation of DNA within an inorganic matrix comprised of silica, iron oxide, or a combination of both. Some estimate that encapsulation in silica particles could maintain DNA for 20-90 years at room temperature, 2000 years at 9.4° C., to over 2 million years at −18° C. However, there are several potential limitations to consider.

First, the physical processes of encapsulation and retrieval take time. Second, the encapsulation of the DNA inherently reduces the information density of the storage system. A layer by layer design with alternating DNA and cationic polyethylenimine with a silica final encapsulation has achieved the best storage density to date in such systems, ~3.4 weight % DNA. However, this is a sacrifice of 1-2 orders of magnitude in information density, which is a significant limitation.

BRIEF DESCRIPTION OF THE DRAWINGS

In order to describe the manner in which at least some of the advantages and features of the invention may be obtained, a more particular description of embodiments of the invention will be rendered by reference to specific embodiments thereof which are illustrated in the appended drawings. Understanding that these drawings depict only typical embodiments of the invention and are not therefore to be considered to be limiting of its scope, embodiments of the invention will be described and explained with additional specificity and detail through the use of the accompanying drawings.

FIG. 2 discloses aspects of a glucose-6-phosphate molecule that may be employed in some embodiments of the invention.

FIG. 3 discloses a table comparing the properties of various biopolymers.

DETAILED DESCRIPTION OF SOME EXAMPLE EMBODIMENTS

Figure 1:
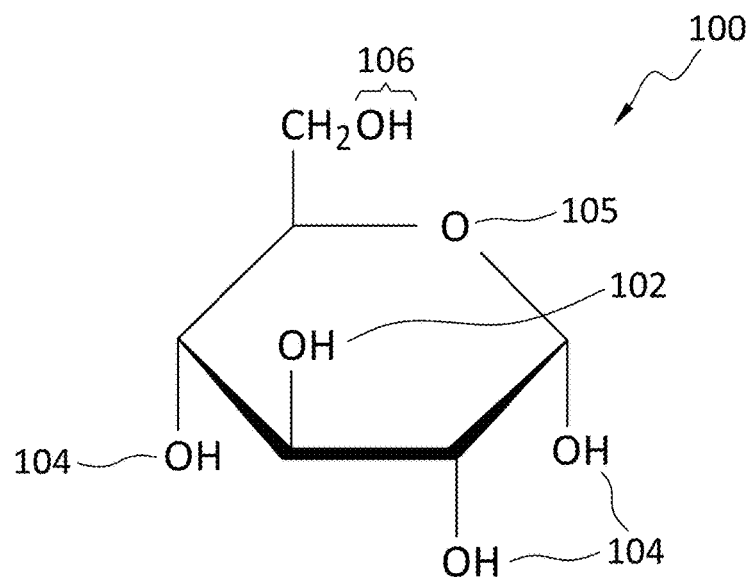
FIG. 1 discloses aspects of an example monosaccharide that may be employed in example embodiments.

Embodiments of the present invention generally relate to archive storage. More particularly, at least some embodiments of the invention relate to systems, hardware, software, computer-readable media, and methods for the use of polysaccharides for archival data storage and associated IO operations.

In one example embodiment, a polysaccharide, which may be in a chain or branched form, is synthesized whose particular structure embodies an encoding of data. The synthesis process thus constitutes a write operation. The encoded data may later be read out, such as in response to an IO, by mapping out the structure of the polysaccharide and then traversing the mapped structure.

Embodiments of the invention, such as the examples disclosed herein, may be beneficial in a variety of respects. For example, and as will be apparent from the present disclosure, one or more embodiments of the invention may provide one or more advantageous and unexpected effects, in any combination, some examples of which are set forth below. It should be noted that such effects are neither intended, nor should be construed, to limit the scope of the claimed invention in any way. It should further be noted that nothing herein should be construed as constituting an essential or indispensable element of any invention or embodiment. Rather, various aspects of the disclosed embodiments may be combined in a variety of ways so as to define yet further embodiments. Such further embodiments are considered as being within the scope of this disclosure. As well, none of the embodiments embraced within the scope of this disclosure should be construed as resolving, or being limited to the resolution of, any particular problem(s). Nor should any such embodiments be construed to implement, or be limited to implementation of, any particular technical effect (s) or solution(s). Finally, it is not required that any embodiment implement any of the advantageous and unexpected effects disclosed herein.

In particular, one advantageous aspect of at least some embodiments of the invention is that a polysaccharide that encodes data may be relatively stable and robust over a range of environmental conditions. An embodiment may implement data storage in a polysaccharide whose storage capacity is one, two, or more, orders of magnitude larger than binary or DNA storage. Various other advantageous aspects of example embodiments will be apparent from this disclosure.

A. Overview

As noted in https://en.wikipedia.org/wiki/Polysaccharide, "Polysaccharides are the most abundant carbohydrate found in food, and some are already used widely in the industry for many uses (other than nutrition). Examples include [energy] storage polysaccharides such as starch, glycogen and galactogen and structural polysaccharides such as cellulose and chitin. They are long chain polymeric carbohydrates composed of monosaccharide units bound together by glycosidic linkages. This carbohydrate can react with water (hydrolysis) using amylase enzymes as catalyst, which produces constituent sugars (monosaccharides, or oligosaccharides). They range in structure from linear to highly branched. Polysaccharides are often quite heterogeneous, containing slight modifications of the repeating unit. Depending on the structure, these macromolecules can have distinct properties from their monosaccharide building blocks."

DNA digital data storage is the process of encoding and decoding binary data to and from synthesized strands of DNA. While DNA as a storage medium may have significant potential because of its high storage density, its practical use is currently severely limited because of its high cost and very slow read and write times, although as of 2019, write times had improved to about 4 Mb/s.

While DNA has shown some promise as a storage medium, the polysaccharide data storage embraced by example embodiments of the invention is simpler, denser and has the potential to surpass DNA as a storage medium.

B. Detailed Discussion of Some Example Embodiments

B.1 Introduction

The data era is characterized by an overwhelming amount of data that is being generated and stored. As the amount of data collected, managed, and analyzed in a modern data center keeps growing at an exponential rate, the need for new and better storage methods is generally acknowledged.

Of the data collected, regulatory and various other reasons necessitate vast amounts of archival storage. Currently such archival storage is done with disks, which experience shortages and, in addition, their manufacture requires the mining of rare earth metals, and the industrial processes involved in such mining may severely harm the environment. Another solution which is being developed is DNA storage, which will become a better solution in the long run but is not without its faults.

In light of considerations such as these, example embodiments are directed to a form of next-generation data storage using polysaccharides, sometimes referred to as 'long sugars' as they may take the form of chain structures or branch structures that include multiple monosaccharides connected together. When employed as a data storage medium, polysaccharides may provide greater storage and better stability than DNA storage. Moreover, polysaccharides are chemically and physically stable and do not require special storage conditions. For example, polysaccharides may be reliably stored in the same types of environments, for example, with regard to moisture and temperature ranges, that are recommended for magnetic or silicon-based storage. Further, polysaccharide archival data storage according to example embodiments may take the form of thin layers that can be efficiently stored.

B.2 Aspects of Example Embodiments

In general, example embodiments are directed to polysaccharide data storage media at solid state for data archiving. Polysaccharides may be particularly well suited for data storage due to the complexity possibilities of polysaccharides and the ease of their maintenance in solid form. Example embodiments may provide various functionalities in connection with polysaccharide data storage media. These functionalities include: (1) write operations, and addressing, for the polysaccharide data storage media; (2) storage/maintenance of the polysaccharide data storage media storage media; and (3) read operations, that is, reading data from the polysaccharide data storage media. Note that while the description herein covers basic operations of storage, all existing RAID technologies may be applied directly to this solution.

With reference now to FIG. 1, one example of a monosaccharide sugar that may be used for example embodiments is glucose, whose chemical structure is denoted at 100. With the $CH_2OH$ direction as reference, note that the OH groups can either face in its direction or opposite to it. As there are 4 such OH groups, glucose has 24 that is, 16, enantiomers, each with distinct respective structural, optical, and biological characteristics. Put another way, each of the OH groups may be analogized to a bit that has one of two positions, namely, each OH group extends either (1) in the direction of the $CH_2OH$, as in the case of OH group 102, or (2) away from the $CH_2OH$, as in the case of OH groups 104.

Any number of monosaccharides, such as the glucose 100 for example, can then be linked to each other via glycosidic bonds to create more complex compounds referred to as polysaccharides, known examples of which are glycogen, cellulose and starch. With reference again to the example of FIG. 1, there are 5 OH groups that can participate in the glycosidic bond from each monosaccharide to another (1-4 and 6, as the 5th oxygen 105 is a part of the main ring), that is, the OH groups 102, 104, and 106.

Thus, for a single polysaccharide chain of glucose enantiomers only, its representation power can be compared to that of a bit sequence and DNA sequence.

TABLE 1

| Method | Representation power-n-length sequence |
|---|---|
| Bit sequence | $2^n$ |
| DNA sequence | $4^n$ |
| Polysaccharide sequence | $16^n$(enantiomers) * $5^n$ * $4^{n-2}$(bonds) |

As shown in Table 1, a bit sequence with 'n' positions can represent $2^n$ possibilities, and a DNA sequence with 4 possible values for each of 'n' positions can represent $4^n$ possibilities. In contrast, the representation power of a polysaccharide sequence, that is, the amount of data that can be represented by a polysaccharide sequence, with 'n' monosaccharides is significantly greater than that of a bit sequence or a DNA sequence. It was noted earlier that glucose has 16 enantiomers, due to the fact that it has 4 OH groups, each of which can assume 2 different orientations ($2^4$). Given that, the 4 OH groups can collectively define 16 different configurations, or enantiomers, of the glucose 100. Thus, with reference again to Table 1, the total number of representations possible with a group of 'n' monosaccharides is the number of enantiomers ($16^n$)×the number of possible bonds ($5^n 4^{n-2}$). Note that there are typically 4 options on the initiator, as one of the 5 is taken by the last bond, unless it is the first monosaccharide, or the last one which is not an initiator, and 5 on the second monosaccharide in the bond.

This approach results in a base 320 numeral system, in which each digit in a numeral can have any of 320 different values. In contrast, a conventional bit sequence is a base 2 system where each bit can be 0 or 1, and DNA is a base 4 system. Thus, an ability of some example embodiments to represent data is at least 2 orders of magnitude greater than the respective abilities of a bit, or DNA, to represent data.

Following is a discussion of some example IO operations that may be performed by various embodiments of the invention.

Figure 1A:
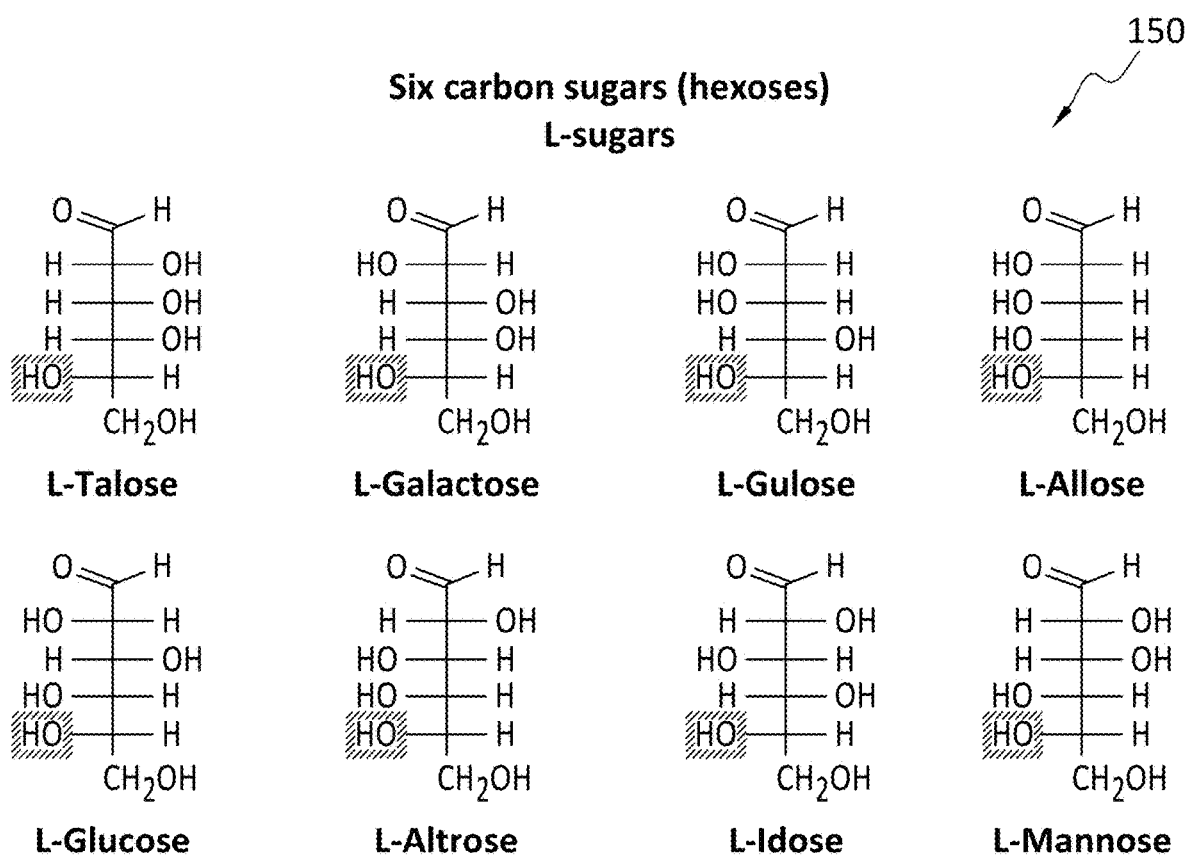
FIG. 1a discloses some example enantiomers that may be employed in example embodiments.

FIG. 1a discloses some other example enantiomers 150 that may be employed in some embodiments of the invention. It is noted that no particular enantiomer(s) are required to be used in any embodiment.

B.3 Write Operations, and Addressing

First, it may be determined how to represent information held in the polysaccharide sequence. For the sake of simplicity, and continuing with the example noted above, some example embodiments may employ a representation power $16^{n-1}$ (enantiomers)*$5^{n-1}$*$4^{n-1}$ (bonds). Thus, embodiments may use 16*5*4=320-base numeral system. At this point, it is a matter of moving from a number from a binary base to a 320-base. Consequently, each numeral in the resulting number represents a specific monosaccharide enantiomer and the bond details to the next monosaccharide. Thus, the polysaccharide sequence embodying the data to be written is obtained.

After the needed polysaccharide sequence has been determined, that sequence must then be synthesized. Details concerning the synthesis of some example polysaccharides can be found at: https://pubs.acs.org/doi/abs/10.1021/jacs.0c00751, which is incorporated herein in its entirety by this reference. Briefly summarized, a synthesizer method and system may be used to perform an AGA (Automated Glycan Assembly) process to synthesize polysaccharides such as may be employed in some example embodiments of the invention. Currently, polysaccharide synthesis using the AGA approach may take hours, but the speed is rapidly improving and, with parallelism, sufficient speeds for data archiving applications are expected by some to be only a few years in the future.

With reference now to FIG. 2, a glucose-6-phosphate molecule 200 is shown. In this illustrative embodiment, the first monosaccharide 202 is labeled for use as a point of reference for later reading as the starting point. That is, data represented by a polysaccharide that includes the monosaccharide of FIG. 2 may be read out by traversing the polysaccharide beginning at the labeled starting point. In the example of FIG. 2, the first monosaccharide 202 is labeled with a phosphate group 204 connected to the 6th carbon. However, different labels and/or locations of labels may be employed in other embodiments. Thus, the example of FIG. 2 is provided for the purposes of illustration and is not intended to limit the scope of the invention in any way.

In the example of FIG. 2, an 'n' length bit sequence can be represented by a polysaccharide sequence of length L thus:

$$L = [n/(\log_2(320)) + 1],$$

where $\log_2(320)$ is approximately 8.322.

By comparison, an 'n' length bit sequence would require a DNA sequence length of L=[n/2] for representation.

With reference now to FIG. 3, a table 300 is disclosed that compares properties of various biopolymers, including the capped sizes for chemical synthesis, before merging into large units such as chains or branched configuration, of the different biopolymers. As shown in the table 300, the amount of information in a 100-mer polysaccharide sequence, that is based on the example monosaccharide disclosed herein that employs only 16 enantiomers, is equivalent to a DNA sequence ~415 long. Thus, the 100-mer polysaccharide sequence presents 2.1×(415/200) improvement over the current 200 length of the DNA sequence.

Embodiments of the invention include various configurations of a polysaccharide data storage entity. Such configurations include, for example, a chain of monosaccharides connected together to define a polysaccharide data storage entity. Another example configuration of a polysaccharide data storage entity comprises a branched arrangement of monosaccharides. Further, some embodiments of a polysaccharide storage entity may be 'flat,' that is, two dimensional, while other embodiments of a polysaccharide storage entity may be three dimensional. It is noted that the scope of the invention is not limited to any particular monosaccharide, or polysaccharide, form or configuration.

Figure 4:
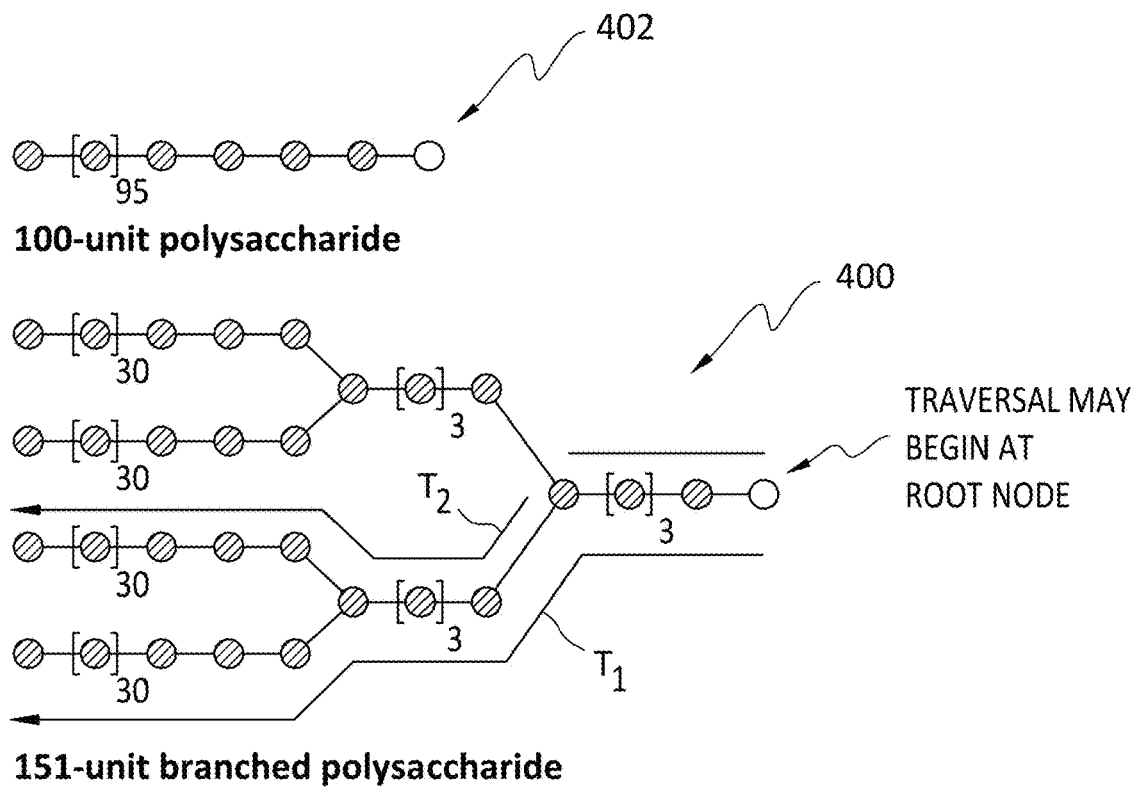
FIG. 4 discloses examples of a chain polysaccharide, and a branched polysaccharide, such as may be employed in some embodiments of the invention.

Polysaccharide synthesis techniques, such as AGA for example, may enable creation of highly branched polysaccharides. Illustrative examples of a branched polysaccharide 400, and chain polysaccharide 402, are disclosed in FIG. 4. As shown in FIG. 4, the tree structure of the polysaccharide 400 imposes a particular order on the molecules that make up the polysaccharide 400. This particular order, which may be specified as part of the polysaccharide 400 synthesis process, may embody particular data when the tree structure is traversed as part of a data read process.

One or more traversals of the tree structure, such as implemented by the polysaccharide 400, may be employed as part of a data read process. For example, a traversal may begin at the root of the tree, and then follow all branches to the left, before returning to the root or another starting point and next traversing, for example, the branches to the right. The order in which the tree is traversed may thus define particular data. Accordingly, a single tree may represent various different data, depending upon the particular order (s) in which that tree is traversed. For example, a particular traversal of a tree may define a particular file, or object. It is noted that the scope of the invention is not limited to any particular tree, tree size or structure, traversal order, or traversal process.

Figure 5:
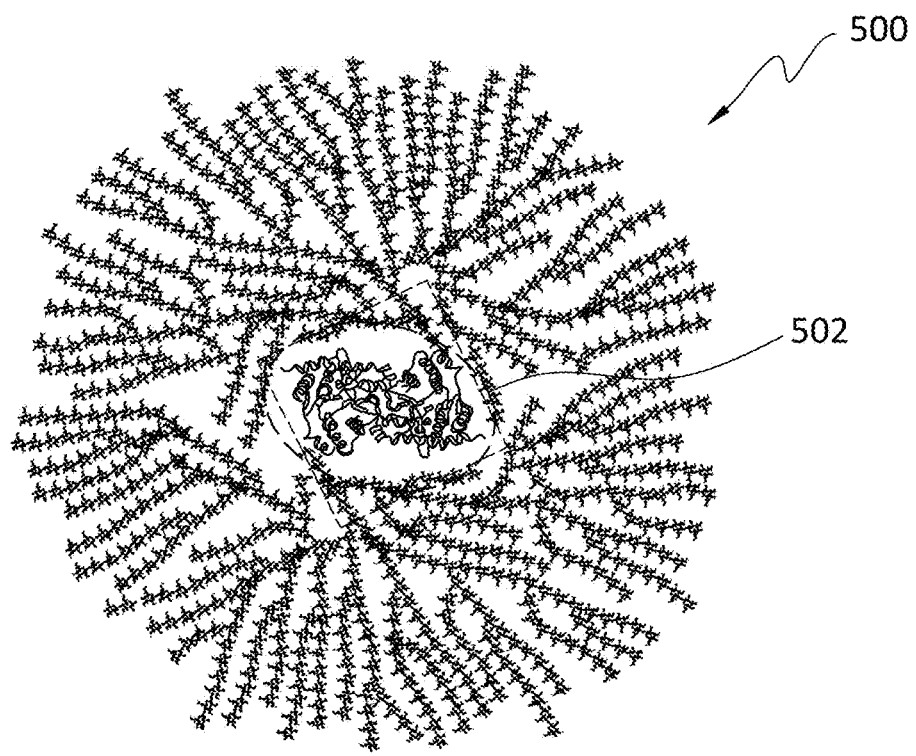
FIG. 5 discloses an example of a branched polysaccharide attached to a protein, that may be employed in some example embodiments of the invention.

FIG. 5 discloses an alternative embodiment of a branched polysaccharide 500, specifically, glycogen, connected to a protein 502. The protein 502 may serve as a starting point for addressing. More specifically, this example branched polysaccharide 500 can be 'flattened' by a BFS (breadth first search) traversal or DFS (depth first search) traversal of the labeled monosaccharide. In a BFS process, also sometimes referred to as a level order traversal, the tree or other structure is traversed, starting at a root node for example, level by level so that all nodes of a level are traversed before the process moves to the next lower level, where the process is repeated. In a DFS process, the structure is traversed, starting from the root node for example, and the nodes explored as far as possible, such as by traversing, as shown by $T_1$ in FIG. 4, to the left of the root node and continuing to traverse left at each node, until a node is reached that does not have any unvisited adjacent nodes. At this point, the traversal process may backtrack to the root node, or other traversal starting point, and then traverse as shown by $T_2$ in FIG. 4, and the traversal process may continue until all the nodes have been visited.

Branched polysaccharides may enable the use of relatively stabler and more compact polysaccharide structures. Moreover, branched polysaccharides provide an addressing system to data location, that is, the DFS traversal sequence is deterministic and linear and can thus provide a "tape" like addressing system. In effect, the branches in the polysaccharide structure serve as elements of the addressing system, since each branch guides the traversal process in a particular direction to a particular destination.

B.3 Storage and Maintenance of Polysaccharide Data Storage

Figure 6:
FIG. 6 is an image of physical polysaccharides, specifically, starch.

As polysaccharides, such as the example polysaccharides 600 in FIG. 6, are typically very stable in solid form, there may not be any special requirements to their storage. Polysaccharides may, for example, be saved as layers or a 'sugar ball' or 'sugar cube' weighing only a few grams. When archiving very large amounts of data, it may be necessary to have more than one 'sugar ball' or 'sugar cube' to ensure that all the data is represented. In such cases, the sugar balls may be placed in ordered compartments, or stored in any other suitable manner, to signify their order relative to each other. In this way, the data encoded in the polysaccharides may be read out in the correct order. Polysaccharides are generally stable in temperatures well below freezing and above ~70° C., although the threshold temperatures may vary from one polysaccharide to another. Moisture conditions that can be tolerated by polysaccharides may be similar to those defined for the safe storage of conventional magnetic and electronic media. Moreover, polysaccharide data storage are resistant to magnetic fields and other phenomena that may damage conventional magnetic and electronic media and may corrupt the data stored on such conventional media. Finally, polysaccharide data storage may be resistant to unauthorized access since it cannot be read or accessed with the devices typically used to read conventional magnetic and electronic storage media.

B.4 Reading Data Out from Polysaccharide Data Storage

In general, a data read operation may be performed by mapping out the structure, or topology, of the polysaccharide. After the structure is mapped, the starting point, such as the root node in FIG. 4 for example, is detected, and a traversal can be performed beginning at that starting point.

In more detail, and given a solid form, such as a 'sugar ball' for example, of the polysaccharide, an example read process may comprise, first, determining the structure of the polysaccharide. This determination of the structure may be performed using, for example, an NMR (nuclear magnetic resonance) imaging process, or a crystallography process such as may be performed with an X-ray device, or any other device capable of determining the structure of a polysaccharide. The structure may then be traversed and, as a result of the traversal, an X-base number may be determined that corresponds to the path traversed, where X may be 320, in some example embodiments. Note that the scope of the invention is not limited to any particular base system, and reference to a 320-base system is only by way of example, and not limitation.

Next, the resulting X-base number may be converted to its binary representation, which is the data original binary sequence, that is, the data, that was encoded in the polysaccharide. It should be noted that depending on the reading technique employed, it is possible that some amount of the storage material, that is, the polysaccharide, may be lost in the process. This problem may be addressed by making larger 'sugar balls' or chunks than are needed to store the data. These larger chunks would allow for multiple read cycles, and the corresponding losses of storage material that could occur with each read cycle. Because some embodiments are directed to polysaccharide archival data storage, it may be the case that the stored data will be read only rarely, if ever.

As noted earlier, a polysaccharide data storage medium may take the form of 'sugar cubes' or 'sugar balls,' for example. It that sense they are used similarly to the way a tape cassette or CD are used, that is, there is a device to write the data. The result is a cube or other form of data storage that a user can eject from the write device and store elsewhere. To read the polysaccharide data storage media, the user may "load" the cube or other form of polysaccharide data storage media into a read device and read out the data. Note that this is different from how a magnetic disk or SSD, for example, are used. This also means that when reading, the technology used to read the storage media may have advanced during the time when that media was in storage. This is particularly likely where archive media is concerned since a relatively long period of time may pass between the time when the archive media is stored, and the time when it is subsequently accessed. Thus, there is no direct connection between the write and read processes. In the same way, a new and faster CD device can still read media produced by older and slower write devices. Because archival storage is often targeted for years, depending on current read technology for later retrieval is problematic. DNA storage also shares the advantage that it will be readable in the future even after read technologies have advanced. On the other hand, media such as VHS cassettes have the problem that they are not readable by current read technologies, and it is a major industry issue converting all data to updated mediums every few years.

C. Further Discussion

As will be apparent from this disclosure, example embodiments of the invention, which include polysaccharide data storage media, may provide various features and benefits. For example, embodiments of the invention include a system to represent data as a polysaccharide sequence for data archiving. As another example, when compared to drives (bits) or DNA (base pairs), polysaccharide data storage media provide a much larger representation power, and thus can store more data in the same sequence length. Further, when compared to DNA storage, polysaccharide storage media according to example embodiments are more stable and thus require significantly less storage maintenance. In addition, polysaccharide molecules are smaller than nucleic acid molecules. As a final example, embodiments of the invention may enable restoration of vast amounts of data without the use of any metals or other possibly hazardous or rare materials. As such, example embodiments may provide archival data storage media that implies only a minimal environmental footprint.

D. Example Methods

Figure 7:
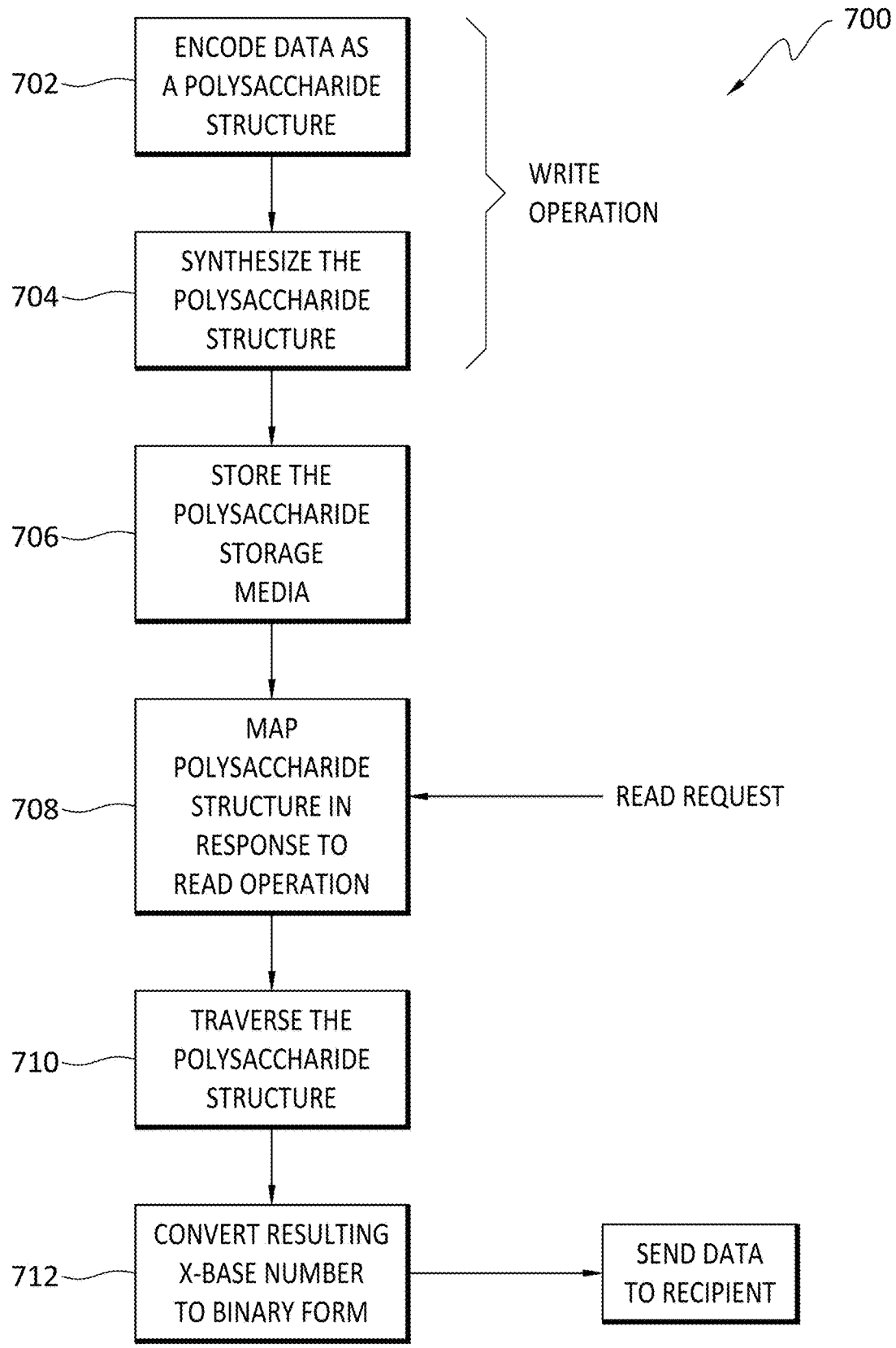
FIG. 7 is an example method according to some embodiments of the invention.

It is noted with respect to the example method of FIG. 7 that any of the disclosed processes, operations, methods, and/or any portion of any of these, may be performed in response to, as a result of, and/or, based upon, the performance of any preceding process(es), methods, and/or, operations. Correspondingly, performance of one or more processes, for example, may be a predicate or trigger to subsequent performance of one or more additional processes, operations, and/or methods. Thus, for example, the various processes that may make up a method may be linked together or otherwise associated with each other by way of relations such as the examples just noted. Finally, and while it is not required, the individual processes that make up the various example methods disclosed herein are, in some embodiments, performed in the specific sequence recited in those examples. In other embodiments, the individual processes that make up a disclosed method may be performed in a sequence other than the specific sequence recited.

Directing attention now to FIG. 7, an example method 700 is disclosed. Portions of the method 700 may be performed using processes and equipment such as, but not limited to, AGA processes and associated equipment, X-ray processes and associated equipment, and crystallography processes and associated equipment. The operation of these various types of equipment may be controlled by a processor executing instructions that are carried on a non-transitory computer readable storage media.

The method 700 may comprise a data write operation, or simply a 'write operation,' which may include encoding data as a polysaccharide structure 702. That is, the specific polysaccharide structure uniquely embodies the data. After the data has been encoded 702 as a particular polysaccharide structure, the polysaccharide structure that embodies the data may then be synthesized 704. Thus, in some embodiments, the operations 702 and 704 together comprise a write operation. The polysaccharide storage media that was created at 704 may then be stored 706. In some embodiments, the polysaccharide storage media that was created at 704 may comprise archive data storage, although the scope of the invention is not limited to the use of polysaccharide storage media as archive data storage.

At some later point in time after the polysaccharide storage media has been stored 706, a read request may be directed to, and received by, a controller or other element in communication with the polysaccharide storage media. In response to receipt of the read request, the polysaccharide structure may be mapped 708. This mapping 708 may comprise, for example, generation of a graphical and/or other representation of the physical polysaccharide structure. After the polysaccharide structure has been mapped 708, the map of the polysaccharide structure may be traversed to obtain a particular number, such as an X-base number for example. The X-base number may then be converted 710 to its binary representation, which is the original binary sequence, that is, the data, that was encoded in the polysaccharide structure. Finally, the data may then be sent to 712 to the requestor.

E. Further Example Embodiments

Following are some further example embodiments of the invention. These are presented only by way of example and are not intended to limit the scope of the invention in any way.

Embodiment 1. A method, comprising: encoding data as a polysaccharide structure; and controlling performance of a process that synthesizes the polysaccharide structure to create polysaccharide storage media that comprises the data.

Embodiment 2. The method as recited in embodiment 1, wherein the polysaccharide structure comprises a plurality of monosaccharides, each of which comprises a respective arrangement of OH groups, and one or more of the OH groups embodies one of two possible configurations.

Embodiment 3. The method as recited in any of embodiments 1-2, wherein the polysaccharide structure comprises a plurality of monosaccharides, and one of the monosaccharides includes a label indicating a starting point for traversal of the polysaccharide structure.

Embodiment 4. The method as recited in any of embodiments 1-3, wherein the polysaccharide structure is a branched polysaccharide structure.

Embodiment 5. The method as recited in any of embodiments 1-4, wherein the polysaccharide structure is a polysaccharide chain.

Embodiment 6. The method as recited in any of embodiments 1-5, wherein the polysaccharide structure is a branched polysaccharide structure that includes a plurality of branches, and each branch serves as an element of an addressing system.

Embodiment 7. The method as recited in any of embodiments 1-6, wherein the operations further comprise: receiving a read request directed to the polysaccharide storage media; controlling performance of a process for mapping the polysaccharide structure to create a map in response to the read request; traversing the map of the polysaccharide structure to determine an X-base number; and obtaining the data by converting the X-base number to a binary form.

Embodiment 8. The method as recited in embodiment 7, wherein the X-base number is a function of: a number 'n' of enantiomers defined by each monosaccharide included in the polysaccharide structure; and, a number of bonds between the monosaccharides.

Embodiment 9. The method as recited in any of embodiments 7-8, wherein the X-base number includes a plurality of numerals, and each numeral represents a respective monosaccharide enantiomer and bond details to an adjacent monosaccharide enantiomer.

Embodiment 10. The method as recited in any of embodiments 7-9, wherein the polysaccharide structure comprises a plurality of monosaccharides, and an order of the monosaccharides in the map defines the data.

Embodiment 11. A method for performing any of the operations, methods, or processes, or any portion of any of these, disclosed herein.

Embodiment 12. A non-transitory storage medium having stored therein instructions that are executable by one or more hardware processors to perform operations comprising the operations of any one or more of embodiments 1-11.

F. Example Computing Devices and Associated Media

The embodiments disclosed herein may include the use of a special purpose or general-purpose computer including various computer hardware or software modules, as discussed in greater detail below. A computer may include a processor and computer storage media carrying instructions that, when executed by the processor and/or caused to be executed by the processor, perform any one or more of the methods disclosed herein, or any part(s) of any method disclosed.

As indicated above, embodiments within the scope of the present invention also include computer storage media, which are physical media for carrying or having computer-executable instructions or data structures stored thereon. Such computer storage media may be any available physical media that may be accessed by a general purpose or special purpose computer.

By way of example, and not limitation, such computer storage media may comprise hardware storage such as solid state disk/device (SSD), RAM, ROM, EEPROM, CD-ROM, flash memory, phase-change memory ("PCM"), or other optical disk storage, magnetic disk storage or other magnetic storage devices, or any other hardware storage devices which may be used to store program code in the form of computer-executable instructions or data structures, which may be accessed and executed by a general-purpose or special-purpose computer system to implement the disclosed functionality of the invention. Combinations of the above should also be included within the scope of computer storage media. Such media are also examples of non-transitory storage media, and non-transitory storage media also embraces cloud-based storage systems and structures, although the scope of the invention is not limited to these examples of non-transitory storage media.

Computer-executable instructions comprise, for example, instructions and data which, when executed, cause a general purpose computer, special purpose computer, or special purpose processing device to perform a certain function or group of functions. As such, some embodiments of the invention may be downloadable to one or more systems or devices, for example, from a website, mesh topology, or other source. As well, the scope of the invention embraces any hardware system or device that comprises an instance of an application that comprises the disclosed executable instructions.

Although the subject matter has been described in language specific to structural features and/or methodological acts, it is to be understood that the subject matter defined in the appended claims is not necessarily limited to the specific features or acts described above. Rather, the specific features and acts disclosed herein are disclosed as example forms of implementing the claims.

As used herein, the term 'module' or 'component' may refer to software objects or routines that execute on the computing system. The different components, modules, engines, and services described herein may be implemented as objects or processes that execute on the computing system, for example, as separate threads. While the system and methods described herein may be implemented in software, implementations in hardware or a combination of software and hardware are also possible and contemplated. In the present disclosure, a 'computing entity' may be any computing system as previously defined herein, or any module or combination of modules running on a computing system.

In at least some instances, a hardware processor is provided that is operable to carry out executable instructions for performing a method or process, such as the methods and processes disclosed herein. The hardware processor may or may not comprise an element of other hardware, such as the computing devices and systems disclosed herein.

In terms of computing environments, embodiments of the invention may be performed in client-server environments, whether network or local environments, or in any other suitable environment. Suitable operating environments for at least some embodiments of the invention include cloud computing environments where one or more of a client, server, or other machine may reside and operate in a cloud environment.

Figure 8:
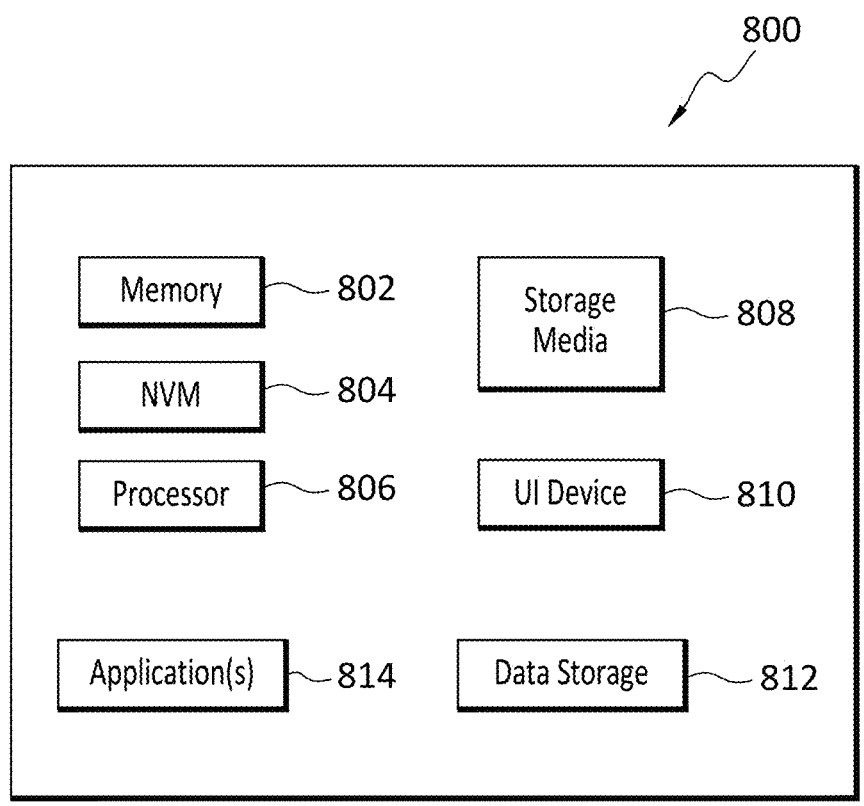
FIG. 8 discloses a computing entity operable to perform and/or control the performance of, any of the disclosed methods, processes, and operations.

With reference briefly now to FIG. 8, any one or more of the entities disclosed, or implied, by FIGS. 1-7 and/or elsewhere herein, may take the form of, or include, or be implemented on, or hosted by, a physical computing device, one example of which is denoted at 800. As well, where any of the aforementioned elements comprise or consist of a virtual machine (VM), that VM may constitute a virtualization of any combination of the physical components disclosed in FIG. 8.

In the example of FIG. 8, the physical computing device 800 includes a memory 802 which may include one, some, or all, of random access memory (RAM), non-volatile memory (NVM) 804 such as NVRAM for example, read-only memory (ROM), and persistent memory, one or more hardware processors 806, non-transitory storage media 808, UI device 810, and data storage 812, one example of which is polysaccharide storage media. One or more of the memory components 802 of the physical computing device 800 may take the form of solid state device (SSD) storage. As well, one or more applications 814 may be provided that comprise instructions executable by one or more hardware processors 806 to perform any of the operations, or portions thereof, disclosed herein.

Such executable instructions may take various forms including, for example, instructions executable to perform any method or portion thereof disclosed herein, and/or executable by/at any of a storage site, whether on-premises at an enterprise, or a cloud computing site, client, datacenter, data protection site including a cloud storage site, or backup server, to perform any of the functions disclosed herein. As well, such instructions may be executable to perform any of the other operations and methods, and any portions thereof, disclosed herein.

The present invention may be embodied in other specific forms without departing from its spirit or essential characteristics. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

What is claimed is:

1. A method, comprising:
 receiving a read request directed to a polysaccharide storage media that comprises data;
 mapping a polysaccharide structure, that is associated with the polysaccharide storage media, to create a map in response to the read request;
 traversing the map of the polysaccharide structure to determine an X-base number; and
 obtaining the data by converting the X-base number to a binary form.

2. The method as recited in claim 1, wherein the polysaccharide structure was synthesized to create the polysaccharide storage media.

3. The method as recited in claim 1, wherein the polysaccharide structure comprises a plurality of monosaccharides, each of which comprises a respective arrangement of OH groups, and one or more of the OH groups embodies one of two possible configurations.

4. The method as recited in claim 1, wherein the polysaccharide structure comprises a plurality of monosaccharides, and one of the monosaccharides includes a label indicating a starting point for traversal of the polysaccharide structure.

5. The method as recited in claim 1, wherein the polysaccharide structure is a branched polysaccharide structure.

6. The method as recited in claim 1, wherein the polysaccharide structure is a polysaccharide chain.

7. The method as recited in claim 1, wherein the polysaccharide structure is a branched polysaccharide structure that includes a plurality of branches, and each branch serves as an element of an addressing system.

8. The method as recited in claim 1, wherein the X-base number is a function of: a number 'n' of enantiomers defined by each monosaccharide included in the polysaccharide structure; and, a number of bonds between the monosaccharides.

9. The method as recited in claim 1, wherein the X-base number includes a plurality of numerals, and each numeral represents a respective monosaccharide enantiomer and bond details to an adjacent monosaccharide enantiomer.

10. The method as recited in claim 1, wherein the polysaccharide structure comprises a plurality of monosaccharides, and an order of the monosaccharides in the map defines the data.

11. A non-transitory storage medium having stored therein instructions that are executable by one or more hardware processors to perform operations comprising:
   receiving a read request directed to a polysaccharide storage media that comprises data;
   controlling performance of a process for mapping a polysaccharide structure, that is associated with the polysaccharide storage media, to create a map in response to the read request;
   traversing the map of the polysaccharide structure to determine an X-base number; and
   obtaining the data by converting the X-base number to a binary form.

12. The non-transitory storage medium as recited in claim 11, wherein the polysaccharide structure was synthesized to create the polysaccharide storage media.

13. The non-transitory storage medium as recited in claim 11, wherein the polysaccharide structure comprises a plurality of monosaccharides, each of which comprises a respective arrangement of OH groups, and one or more of the OH groups embodies one of two possible configurations.

14. The non-transitory storage medium as recited in claim 11, wherein the polysaccharide structure comprises a plurality of monosaccharides, and one of the monosaccharides includes a label indicating a starting point for traversal of the polysaccharide structure.

15. The non-transitory storage medium as recited in claim 11, wherein the polysaccharide structure is a branched polysaccharide structure.

16. The non-transitory storage medium as recited in claim 11, wherein the polysaccharide structure is a polysaccharide chain.

17. The non-transitory storage medium as recited in claim 11, wherein the polysaccharide structure is a branched polysaccharide structure that includes a plurality of branches, and each branch serves as an element of an addressing system.

18. The non-transitory storage medium as recited in claim 11, wherein the X-base number is a function of: a number 'n' of enantiomers defined by each monosaccharide included in the polysaccharide structure; and, a number of bonds between the monosaccharides.

19. The non-transitory storage medium as recited in claim 11, wherein the X-base number includes a plurality of numerals, and each numeral represents a respective monosaccharide enantiomer and bond details to an adjacent monosaccharide enantiomer.

20. The non-transitory storage medium as recited in claim 11, wherein the polysaccharide structure comprises a plurality of monosaccharides, and an order of the monosaccharides in the map defines the data.

* * * * *

UNITED STATES PATENT AND TRADEMARK OFFICE
CERTIFICATE OF CORRECTION

PATENT NO. : 12,417,369 B2
APPLICATION NO. : 18/632154
DATED : September 16, 2025
INVENTOR(S) : Ofir Ezrielev et al.

Page 1 of 1

It is certified that error appears in the above-identified patent and that said Letters Patent is hereby corrected as shown below:

In the Specification

Column 4
Line 61, change "base 320 numeral system" to -- base 320 numeral system --

Column 8
Line 8, change "It that sense" to -- In that sense --

Signed and Sealed this
Sixth Day of January, 2026

John A. Squires
*Director of the United States Patent and Trademark Office*